(12) United States Patent
Chimot et al.

(10) Patent No.: US 10,164,406 B2
(45) Date of Patent: Dec. 25, 2018

(54) TUNABLE LASER DEVICE

(71) Applicant: Alcatel Lucent, Boulogne-Billancourt (FR)

(72) Inventors: Nicolas Chimot, Marcoussis (FR); Helene Debregeas-Sillard, Marcoussis (FR)

(73) Assignee: ALCATEL LUCENT, Boulogne Billancourt (FR)

( * ) Notice: Subject to any disclaimer, the term of this patent is extended or adjusted under 35 U.S.C. 154(b) by 0 days.

(21) Appl. No.: 15/116,076

(22) PCT Filed: Feb. 4, 2015

(86) PCT No.: PCT/EP2015/052264
§ 371 (c)(1),
(2) Date: Aug. 2, 2016

(87) PCT Pub. No.: WO2015/121121
PCT Pub. Date: Aug. 20, 2015

(65) Prior Publication Data
US 2017/0170631 A1 Jun. 15, 2017

(30) Foreign Application Priority Data
Feb. 13, 2014 (EP) .................... 14305187

(51) Int. Cl.
*H01S 5/12* (2006.01)
*H01S 5/0625* (2006.01)
*H01S 5/10* (2006.01)

(52) U.S. Cl.
CPC ........ *H01S 5/1225* (2013.01); *H01S 5/06258* (2013.01); *H01S 5/1064* (2013.01);
(Continued)

(58) Field of Classification Search
CPC .... H01S 5/06258; H01S 5/124; H01S 5/1225; H01S 5/125
See application file for complete search history.

(56) References Cited

U.S. PATENT DOCUMENTS

| 5,642,371 A | 6/1997 | Tohyama et al. | |
| 5,659,562 A * | 8/1997 | Hisa ......................... | H01S 5/12 372/50.11 |

(Continued)

FOREIGN PATENT DOCUMENTS

| EP | 0409487 A2 | 1/1991 |
| JP | 2004273644 A | 9/2004 |
| JP | 2008288352 A | 11/2008 |

OTHER PUBLICATIONS

International Search Report PCT/ISA/210 for International Application No. PCT/EP2015/052264 dated Apr. 29, 2015.
(Continued)

*Primary Examiner* — Michael Carter
(74) *Attorney, Agent, or Firm* — Harness, Dickey & Pierce, P.L.C.

(57) ABSTRACT

A tunable laser device comprises a multi-section distributed feedback (DFB) laser having a first Bragg section including a waveguide and a Bragg grating, a second Bragg section comprising a waveguide and a Bragg grating, and a phase section being longitudinally located between the first Bragg section and the second Bragg section. The phase section is made of a passive material, and each Bragg section has a first longitudinal end joining the phase section and a second longitudinal end opposed to the phase section. The Bragg grating of at least one Bragg section has a grating coupling coefficient which decreases from the first longitudinal end to the second longitudinal end of the at least one Bragg section.

16 Claims, 5 Drawing Sheets

(52) U.S. Cl.
CPC ............ *H01S 5/124* (2013.01); *H01S 5/1215* (2013.01); *H01S 5/1228* (2013.01); *H01S 5/1237* (2013.01)

(56) References Cited

U.S. PATENT DOCUMENTS

| | | | | |
|---|---|---|---|---|
| 2002/0064203 A1* | 5/2002 | Pezeshki | ............. | H01S 5/06258 |
| | | | | 372/64 |
| 2006/0104321 A1* | 5/2006 | He | ........................ | H01S 5/0265 |
| | | | | 372/26 |
| 2007/0297475 A1* | 12/2007 | Sasada | ................... | B82Y 20/00 |
| | | | | 372/44.01 |
| 2010/0290489 A1* | 11/2010 | Agresti | ................ | H01S 5/0265 |
| | | | | 372/26 |

OTHER PUBLICATIONS

Written Opinion of the International Searching Authority PCT/ISA/237 for International Application No. PCT/EP2015/052264 dated Apr. 29, 2015.

Takahiro Numai: "1.5-UM Wavelength Tunable Phase-Shift-Controlled Distributed Feedback Laser", Journal of Lightwave Technology, IEEE Service Center, New York, NY, US vol. 10, No. 2, Feb. 1, 1992, pp. 199-205, XP000267491, ISSN: 0733-8724, DOI: 10.1109/50.120575.

\* cited by examiner

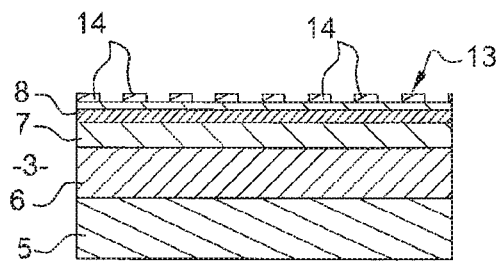
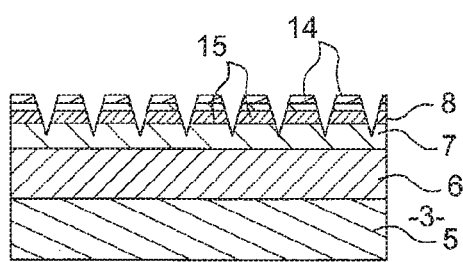
Fig. 6  Fig. 7
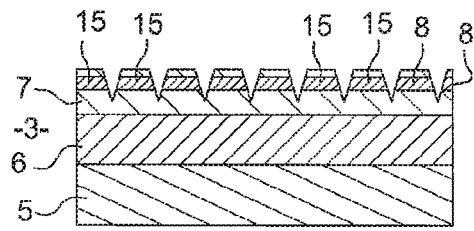
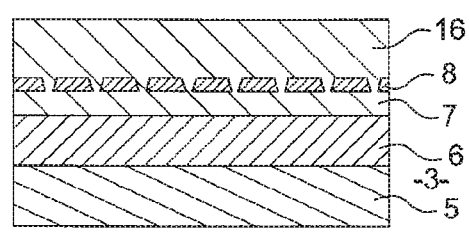
Fig. 8  Fig. 9
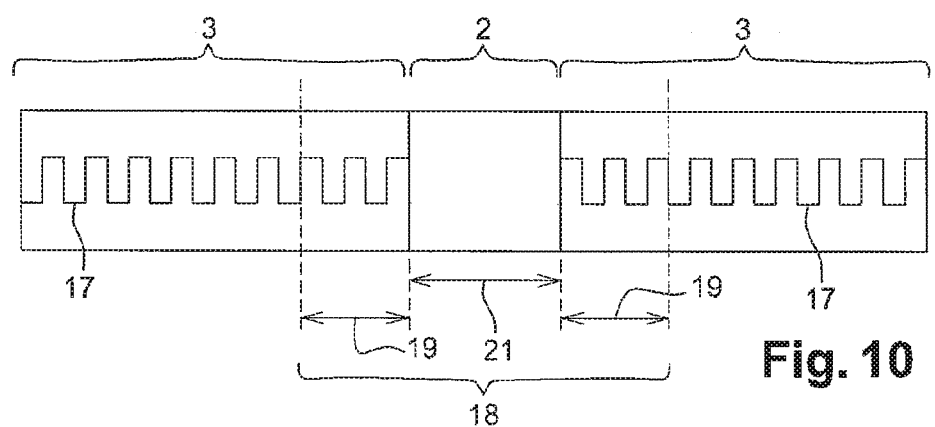
Fig. 10
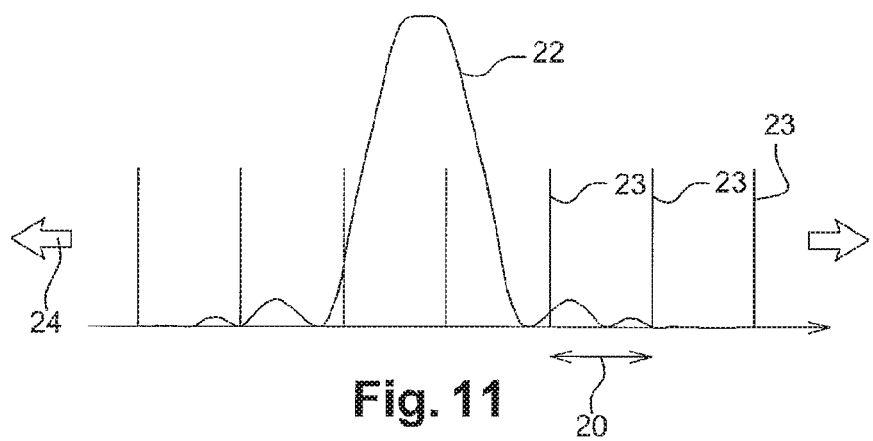
Fig. 11

TUNABLE LASER DEVICE

CROSS-REFERENCE TO RELATED APPLICATIONS

This is a National Phase of PCT Patent Application No. PCT/EP2015/052264 filed on Feb. 4, 2015, and claims priority to, European Application No. 14305187.8, filed Feb. 13, 2014, the contents of each of which are hereby incorporated by reference in their entirety.

FIELD OF THE INVENTION

The invention relates to the field of emission devices used in optical communications, particularly to tunable lasers suitable for Wavelength-division Multiplexing systems.

BACKGROUND

To respond to the growing needs of flow rates in the transmission of information, Wavelength-division Multiplexing systems (WDM) are used. WDM consists in combining a plurality of signals at different wavelengths in a single optical fiber. According to this method, the global flow rate of the optical fiber is the sum of the flows rates of all the signals. However, the wavelength of each signal must be controlled precisely, in emission and in reception, to avoid signal interferences.

An uncontrolled wavelength of the emission of a signal may cause said signal to flow at the same wavelength as another signal in the same optical fiber, causing the quality of both signals to decline. Such interference is also called a spectral collision. The reception of an uncontrolled signal by a receiver device may also cause a degradation of the quality of both signals or even the detection of another signal than the one which was intended to said receiver device. To control the wavelength of each signal transmitted by an optical fiber, optical emitter devices having a tunable wavelength can be used in WDM.

SUMMARY

In an embodiment, the invention provides a tunable laser device comprising a multi-section distributed feedback (DFB) laser having:
  a first Bragg section in active material comprising a waveguide in the form of an elongate strip and a plurality of teeth extending perpendicular to the length direction of the strip of the waveguide, the grating teeth forming a Bragg grating,
  a second Bragg section in active material comprising a waveguide in the form of an elongate strip and a plurality of teeth extending perpendicular to the length direction of the strip of the waveguide, the grating teeth forming a Bragg grating,
  a phase section being longitudinally located between the first Bragg section and the second Bragg section, the phase section being made of a passive material, each Bragg section having a first longitudinal end joining the phase section and a second longitudinal end opposed to the phase section.
wherein the Bragg grating of at least one Bragg section has a grating coupling coefficient which decreases from the first longitudinal end to the second longitudinal end of said at least one Bragg section.

According to embodiments, such tunable laser device may comprise one or more of the features below.

In an embodiment, both Bragg sections have a grating coupling coefficient which decreases from their first longitudinal end to their second longitudinal end, grating coupling coefficients having opposite gradient.

In an embodiment, the Bragg sections comprise a grating layer in the form of an elongate strip, the grating layer comprising the grating teeth.

In an embodiment, the length of the grating teeth in the longitudinal direction of the strip of the grating layer decreases from the first longitudinal end to the second longitudinal end of the at least one Bragg section. In this embodiment, the length of the grating teeth in the longitudinal direction of the strip of the grating layer increases from an initial filing ratio of the grating teeth in the strip of the grating layer in the longitudinal direction of the strip of the grating layer of 50% or more of the length of the Bragg section from the first longitudinal end to the second longitudinal end of said at least one Bragg section or decreases from an initial filing ratio of the grating teeth in the strip of the grating layer in the longitudinal direction of the strip of the grating layer of 50% or less of the length of the Bragg section from the first longitudinal end to the second longitudinal end of the at least one Bragg section.

In an embodiment, the initial filling ratio of the grating teeth in the strip of the grating layer in the longitudinal direction of the strip of the grating layer is between 55% and 45% of the length of the Bragg section at the first longitudinal end of the at least one Bragg section. For instance, the filling ratio of the grating teeth may increase from 55% to 90% or may decrease from 50% to 10%.

In an embodiment, each grating tooth has the same length in the longitudinal direction of the strip of the grating layer and an increasing number of grating teeth are suppressed from the first longitudinal end to the second longitudinal end of said at least one Bragg section.

In an embodiment, the Bragg grating is located in the waveguide of the at least one Bragg section, the grating teeth being etched directly in the waveguide. In this embodiment, the lateral depth of the grating teeth in a width direction perpendicular to the longitudinal direction of the strip of the waveguide decreases from the first longitudinal end to the second longitudinal end of said at least one Bragg section. In an embodiment, the Bragg grating is located on the sides of the waveguide of the at least one Bragg section, the grating teeth being etched directly in the sides of the waveguide. In another embodiment, the Bragg grating is located on the center of the waveguide of the at least one Bragg section, the grating teeth being etched directly in the center of the waveguide.

In an embodiment, the shape of the grating teeth in at least one Bragg section evolves from a shape to another shape from the first end to the second end of said at least one Bragg section.

In an embodiment, the phase section is made of a semiconductor material with a bandgap between 1.3 µm and 1.45 µm.

In an embodiment, one of the Bragg section is longer than the other Bragg section.

In an embodiment, the length of the phase section in the longitudinal direction of the at least one Bragg section is 100 µm.

In an embodiment, the thickness of a space layer located between the grating layer and the waveguide in a depth direction perpendicular to the longitudinal and to the width directions of the strip of the grating layer increases from the first end to the second end of the at least one Bragg section In an embodiment, the index of the grating layer material decreases from the first end to the second end of the at least one Bragg section.

In an embodiment, the phase section includes an electrode able to inject current in the phase section. In an embodiment, each Bragg section includes an electrode able to inject current in said Bragg section.

In an embodiment, the invention also provides a photonic integrated circuit including:
 a tunable laser as described above,
 a modulator connected to the tunable laser to receive an output signal of the tunable laser to be modulated.

In an embodiment, the invention also provides a photonic integrated circuit including:
 a tunable laser as described above,
 a photodiode, the photodiode being located at an end of the tunable laser to monitor an optical power of the tunable laser.

In an embodiment, the invention also provides an optical communication terminal including a tunable laser as described here above.

The invention also provides a method for making a multi-section distributed feedback tunable laser comprising:
 growing a waveguide layer on a substrate,
 growing a grating layer on the waveguide layer,
 depositing a first mask on a first and a second Bragg sections,
 etching the grating layer down to the substrate in a phase section between the first and the second Bragg section,
 growing a passive material in the phase section,
 withdrawing the first mask,
 depositing a second mask on the substrate, said second mask covering entirely the passive material in the phase section and partially the grating layer in the first and second Bragg sections, the second mask having a covering ratio in the Bragg sections,
wherein the covering ratio of the mask in at least one Bragg section decreases from a first longitudinal end of said at least one Bragg section joining the phase section to a second longitudinal end of said at least one Bragg section opposed to the phase section,
 etching the grating layer in areas of the first and second Bragg sections that are not covered by the second mask so as to produce Bragg gratings, wherein the Bragg grating in the at least one Bragg section has a grating coupling coefficient which decreases from the first longitudinal end to the second longitudinal end of said at least one Bragg section.

The invention also provides a method for making a multi-section distributed feedback tunable laser comprising:
 growing a waveguide layer on a substrate,
 depositing a first mask on a first and a second Bragg sections,
 etching the waveguide layer down to the substrate in a phase section between the first and the second Bragg section,
 growing a passive material in the phase section,
 withdrawing the first mask,
 depositing a second mask on the substrate, said second mask covering a strip of the passive material in the phase section and partially a strip of the first and second Bragg sections, the second mask having a covering ratio in the Bragg sections,
wherein the covering ratio of the mask in at least one Bragg section increases from a first longitudinal end of said at least one Bragg section joining the phase section to a second longitudinal end of said at least one Bragg section opposed to the phase section,
 etching the waveguide in areas of the first and second Bragg sections that are not covered by the second mask so as to produce Bragg gratings on the sides of the waveguide, and wherein the Bragg grating in the at least one Bragg section has a grating coupling coefficient which decreases from the first longitudinal end to the second longitudinal end of said at least one Bragg section The invention originates from the observation of the need to precisely control the emitting wavelength of each laser in an optical fiber transmission system. The possibility to tune laser wavelength (~1-2 nm tuning range) with a simple mechanism is advantageous for accurate and simple wavelength control in a feedback loop to ensure that each laser emits precisely on the desired wavelength, e.g on standardized International Telecommunication Union (ITU) wavelengths.

An idea on which the invention is based consists in providing a large frequency modulation capacity to generate specific formats which may be used for instance in coherent transmission with a fast response.

Another aspect of the invention is to propose a tunable laser having a simple control. Another aspect of the invention is to propose a tunable laser which is low power consuming. Another aspect of the invention is to keep the operating lasers at low temperatures. Another aspect of the invention is to provide a tunable laser having a stable output power. Another aspect of the invention is to provide such a laser without mode hops. An idea of the invention is also to provide a tunable laser while maintaining mono-modal characteristics.

BRIEF DESCRIPTION OF THE DRAWINGS

These and other aspects of the invention will be apparent from and elucidated with reference to the embodiments described hereinafter, by way of example, with reference to the drawings.

FIGS. 6 to 9 represent a method of fabrication of a Bragg grating in the tunable laser of FIGS. 1 to 5;

FIG. 10 illustrates schematically an embodiment of a tunable laser which can be made with the method of FIGS. 1 to 5;

FIG. 11 illustrates a schematic view of the Fabry-Perot modes selection by the distributed Bragg reflectivity in the tunable laser of FIG. 10;

DETAILED DESCRIPTION OF THE EMBODIMENTS

FIGS. 1 to 5 illustrate a lateral cross section of a multi-section distributed feedback laser (DFB) 1 during different steps of its fabrication process. The DFB laser 1 has a central section 2 located between two Bragg sections 3. The central section 2, hereafter named phase section 2, is made of a passive material. The Bragg sections 3 are made of active material. Current injection in the Bragg sections 3 generates optical output power. Current injection in the phase section 2 allows wavelength tuning.

Figure 1:
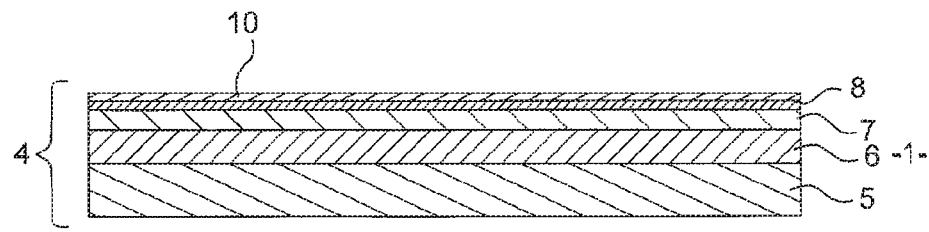
FIGS. 1 to 5 represent a method of fabrication of a tunable laser with a central section made of passive material between two Bragg sections.

In order to fabricate such a DFB laser 1, a wafer 4 includes a substrate layer 5 on which a first layer 6 of active structure is epitaxially grown (FIG. 1). The substrate layer 5 is for instance an InP layer. The active layer 6 is for instance made of a stack of layers, for instance using multi-quantum wells of InGaAsP or InGaAlAs separated by InGaAsP barriers with higher bandgap.

After the growth of the active layer 6, a spacer layer 7 is grown on the active layer 6. The spacer layer 7 can be made of any suitable material, for instance the same material as the substrate layer 5, i.e. an InP layer.

A grating layer 8 is epitaxially grown on the spacer layer 7. The material used to grow this grating layer 8 is selected according to the wavelength which has to be reflected by it, corresponding to the wavelength of emission of the DFB laser 1 in use. Typically, the grating layer 8 is transparent to the selected wavelengths. Preferably, the grating layer 8 presents a high contrast index with InP. For instance, the grating layer is made of a quaternary InGaAsP material having an energy gap corresponding to a photoluminescence wavelength between 1.17 and 1.4 microns (denoted by Q1.17 and Q1.4 respectively) for a component operating in the C band around 1.55 μm.

Figure 2:
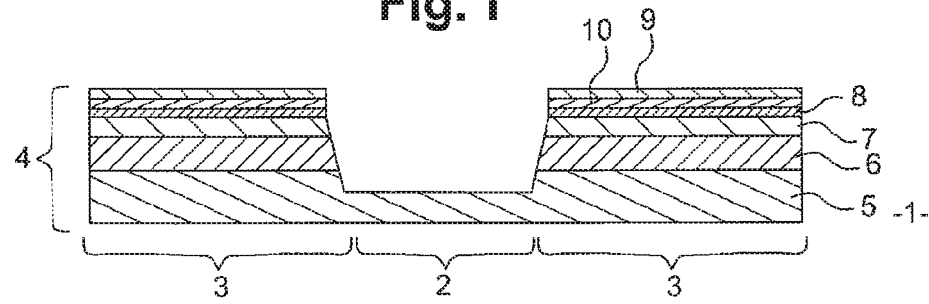

In order to create a phase section 2 made of passive material, a mask 9 is deposited on an upper face of the wafer 4, This mask 9 is opened in the areas corresponding to phase sections 2 of the DFB lasers 1 fabricated on the wafer 4. For each DFB laser 1 fabricated on the wafer 4, the phase section 2 has for instance a length of 100 μm. The wafer 4 may comprise hundreds of such DFB lasers 1. This length guarantees a 360° phase shift to cover the entire range of tunability whatever the initial arbitrary phase conditions are. In a non-illustrated embodiment, the phase section 2 is longitudinally un-centered to optimize the output power of the laser. The longitudinal sections on which the mask 9 is deposited will form the Bragg sections 3. Such mask 9 is for instance a $SiO_2$ mask. As shown in FIG. 2, the wafer is etched in the un-masked sections. Such an etching step is executed according to any suitable method, for instance a mechanical or chemical etching method.

Figure 3:
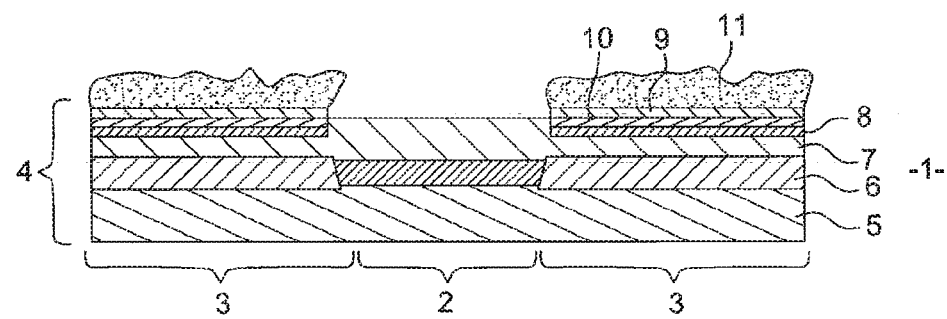

The phase section 2 is then regrown with a passive layer (FIG. 3). This regrowth can be done by different epitaxy methods as for instance MBE (Molecular Beam Epitaxy), MOVPE (MetalOrganic Vapor Phase Epitaxy) or others. The phase section 2 is made of a thick semiconducting material with a bandgap selected according to the wavelength of emission of the DFB laser 1 in use, typically having an energy gap corresponding to a photoluminescence wavelength between 1.3 μm and 1.45 μm.

Figure 4:
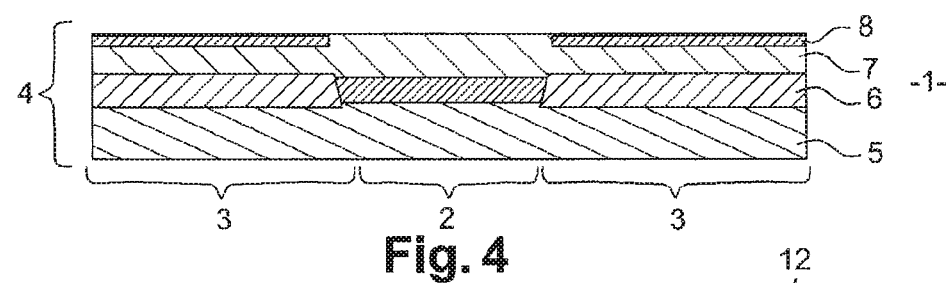

As only a polycristal 11 grows on the $SiO_2$ mask 9 during the epitaxy regrowth step, the mask 9 can be simply lifted-off and the structure 4 obtained includes a phase section 2 made of passive material located between two side sections having an active layer 6 and a grating layer 8 (FIG. 4). Such a process to fabricate a DFB laser is called a Butt joint process, however others process could be used to fabricate the DFB laser.

Figure 5:
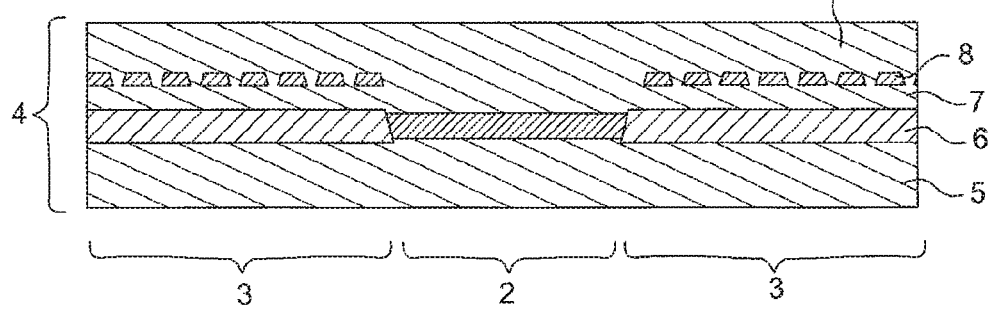

As explained hereafter with reference to FIGS. 6 to 9, a Bragg grating is then etched in the two Bragg sections 3 (FIG. 5). After the two Bragg gratings have been etched, an InP regrowth 12 is made on both grating layers 8 and on the phase section 2. FIGS. 6 to 9 represent the lateral cross section of a Bragg grating during its fabrication process in the tunable DFB laser 1 of FIGS. 1 to 5.

In order to fabricate a Bragg section 3, a mask 13, for instance in $SiO_2$, is used. Such mask 13 covers the whole wafer 4, notably the phase section 2. The mask 13 is locally etched, using for instance an e-beam writing and dry etching process, leading to a plurality of portions 14 of the mask 13 covering the grating layer 8 (FIG. 6).

When all the portions 14 of the mask 13 have been created, the wafer 4 is mechanically or chemically etched (FIG. 7). A plurality of shapes 15, hereafter named grating teeth 15, results from the etching. Once these grating teeth 15 are formed, the mask 13 is removed (FIG. 8) and an epitaxial regrowth 16 is made to obtain the final Bragg grating (FIG. 9).

The mask 13 may be fabricated by a plurality of methods according to the material used for the wafer and/or to the etching process. For instance the mask 13 may be in photoresist. The process may also include the fabrication of a first mask in photoresist in order to create a second mask in $SiO_2$. For instance, the second $SiO_2$ mask may be covered with a uniform photoresist layer. The photoresist mask layer may be then locally insulated (typically with an e-beam writing equipment) and developed, thereby creating openings. This mask is then used to etch the SiO2 mask 13, thereby transferring the openings to SiO2.

FIG. 10 illustrates schematically an embodiment of a tunable laser which can be made with the method of FIG. 1.

In this illustration, both Bragg sections 3 are schematically represented with a regular Bragg grating 17, i.e. with Bragg grating 17 having a constant coupling coefficient of the grating layer. The phase section 2 does not have any Bragg grating and is made of passive material with respect to operating wavelengths.

The lasing peaks of the device are equivalent to Fabry-Perot modes of a central pseudo-cavity 18 roughly constituted by the phase section 2 and two times the penetration depth 19 of the optical mode into both Bragg sections 3. Typically, the Free Spectral Range 20 (FSR, shown on FIG. 11) of the DFB laser 1 is defined by the equation $$FSR = \frac{\lambda^2}{(2*ngBragg*Lp + 2*ng\varphi*L\varphi)},$$

where $\text{ng}_{Bragg}$ and $\text{ng}_\varphi$ are the group index of respectively the Bragg sections and the phase section and where $L_p$ is the penetration depth of the optical mode and $L_\varphi$ is the length 21 of the phase section 2.

FIG. 11 illustrates a schematic view of the Fabry-Perot modes selection by the DFB laser 1 of FIG. 10. More particularly, FIG. 11 shows the reflectivity of each Bragg section, seen from the extremity of the phase section, and the different modes 23 of the Fabry-Perot pseudo-cavity 18 in the DFB laser 1. In use, the lasing peak is selected by the Bragg reflectivity 22 of the Bragg sections 3. The selected lasing peak corresponds to the mode of the Fabry-Perot pseudo-cavity with the wavelength closest to the maximum of Bragg reflectivity.

When current is injected in the phase section 2, for instance using an electrode included in the phase section 2, the refractive index of the phase section 2 is reduced mainly through plasma effect. Consequently, the phase condition is modified, leading to wavelength tuning as symbolyzed by the arrow 24. By current injection, the Fabry-Perot modes 23 selected by the Bragg reflectivity 22 are blue-shifted, leading to a mode hop towards the next mode of the Fabry-Perot pseudo-cavity with an higher wavelength.

Figure 12:
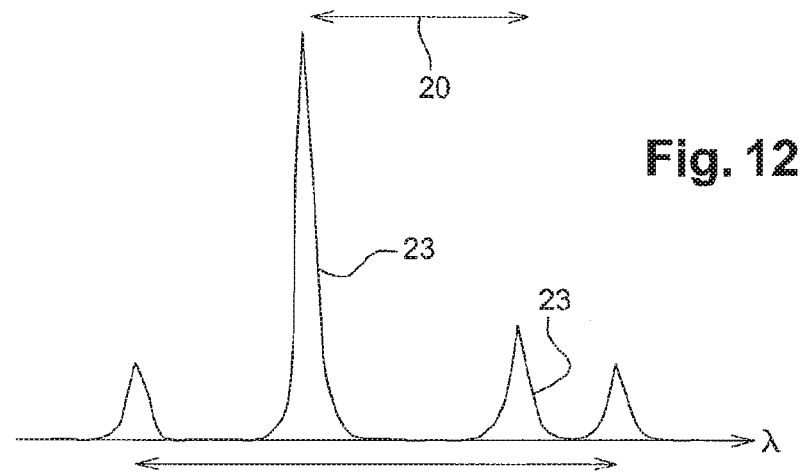
FIGS. 12 and 13 illustrate a schematic view of the modes inside the stop-band of a tunable laser of FIG. 10.
Figure 13:
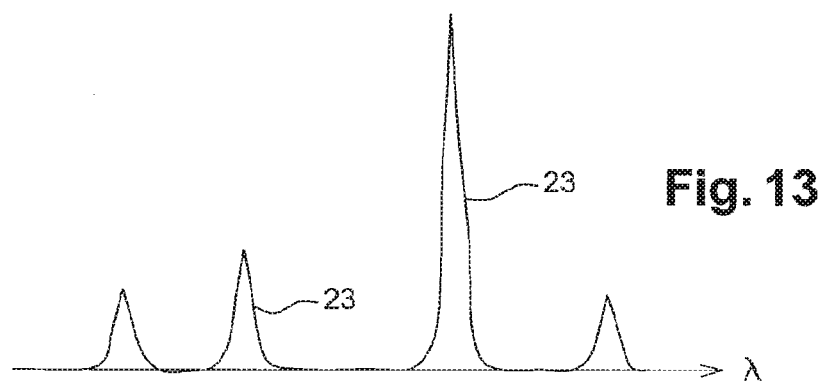

FIGS. 12 and 13 illustrate a schematic view of the modes inside the stop-band of the tunable laser of FIG. 10. The tuning range achievable for a given device structure is at a first order limited to the FSR 20 of the Fabry-Perot pseudo-cavity 18. Only the modes 23 included in the Bragg reflectivity 22 are reflected by the DFB laser 1. The current injection in the phase section 2 allows to change the selected mode.

In order to increase the tuning range of the DFB laser 1, it is necessary to increase the FSR 20, that is to reduce the length of the Fabry-Perot pseudo-cavity 18. Firstly, the length of the phase section is reduce as possible, but has to remain sufficient to provide 360° phase tuning, leading to typically 100 microns. Secondly, the Bragg penetration length is reduced by increasing the coupling coefficient of the Bragg sections. However a high coupling coefficient broadens the Bragg reflectivity spectrum 22, leading to a poor mode selectivity of the Fabry-Perot pseudo-cavity and eventually multimodal operation.

To keep a mean value of the grating coupling coefficient allowing a monomodal behavior while reducing the length of the Fabry-Perot pseudo-cavity 18, the DFB laser 1 uses a variable grating coupling coefficient along the Bragg sections 3. Typically, such a variable grating coupling coefficient has a strong grating coupling coefficient on both sides of the phase section to reduce the penetration length and these grating coupling coefficients decrease gradually up to the longitudinal edges of the Bragg sections 3 to keep a mean value of the grating coupling coefficient at a value compatible with standard operating laser conditions. The writing time of the grating pitches may be as short as for a standard grating.

Figure 18:
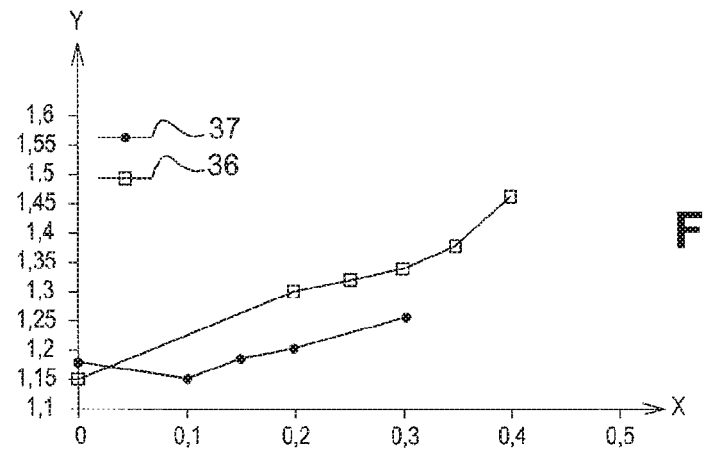
FIG. 18 is a graphical representation of the tuning capacity of a tunable laser as a function of a grating strength modulation

Using a variable grating enables to increase the value of grating coupling coefficient close to the phase section at higher values to reduce the length of the Fabry-Perot pseudo-cavity 18. Still, the mean value of the grating coupling coefficient is kept sufficiently low to maintain a sufficient mode selectivity. Different embodiments of such DFB laser 1 are now described with reference to FIGS. 14, 15 and 5. The tunable capacity of such DFB laser 1 is illustrated in FIG. 18, in which the simulated tuning range is drawn as a function of grating strength modulation along the DFB laser sections. In FIG. 18, the effective running Y is represented along the odinate axis in nm and the grating strength modulation X is represented along the abscissa in $cm^{-1}/\mu m$.

Figure 14:
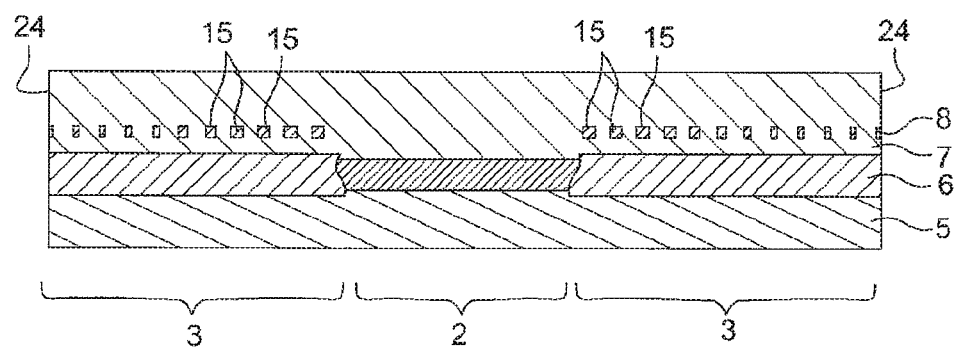
FIGS. 14 and 15 represent a tunable laser having a central section made of passive material between two Bragg sections with a variable grating coupling coefficient in opposed orientations.
Figure 15:
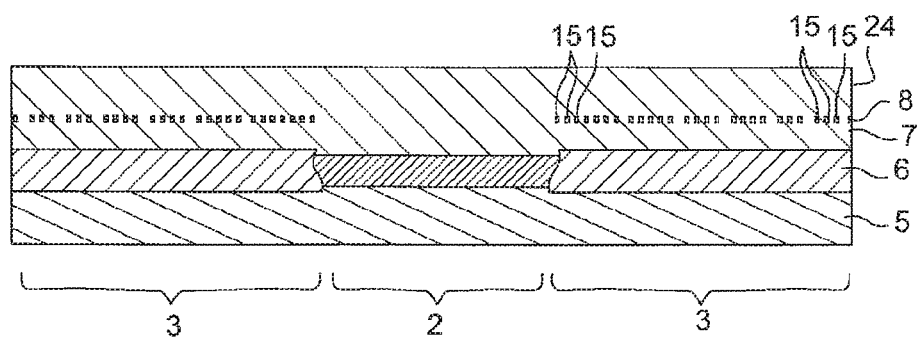

FIGS. 14 and 15 illustrate a lateral cross section of an embodiment of a tunable laser having a central section made of a passive material between two Bragg sections with a variable grating coupling coefficient. The variation of the grating coupling coefficient of the two Bragg sections is in opposed orientations.

The fabrication of the DFB laser 1 according to this embodiment includes the same steps as the fabrication of a DFB laser 1 as described in regard of FIGS. 1 to 5. However, the mask 13 used to etch the grating layer 8 has a particular shape aiming to change the grating coupling coefficient of the Bragg sections 3 from one longitudinal end of each Bragg section 3 to the other longitudinal end. More particularly, the grating coupling coefficient of grating layer 8 decreases from the phase section 2 to each longitudinal edge 24 of the DFB laser 1.

To fabricate such a DFB laser 1, the mask 13 used to etch the grating teeth 15 includes a plurality of portions 14 having different characteristics. For instance, to fabricate a DFB laser 1 as visible in FIG. 14, the length of the portions 14 used for the mask 13 on both Bragg sections 3 gradually decreases from the phase section 2 to the longitudinal edge 24 of the DFB laser 1, while keeping a constant pitch between teeth. As the length of the portions 14 used for the mask 13 decreases from the phase section 2 to the longitudinal edge 24 of the DFB laser 1, the length of the grating teeth 15 resulting from the step of etching of the grating teeth 14 decreases too from the phase section 2 to the longitudinal edge 24 of the DFB laser 1. Such a diminution of the length of the grating teeth 15 causes a diminution of the filling ratio of the grating layer 8.

FIG. 15 shows another embodiment in which the coupling coefficient of grating layer 8 is gradually decreasing from the phase section 2 to the longitudinal edge 24 of the DFB laser 1. In this embodiment, the length of each grating tooth 15 is the same along the Bragg section 3, but an increasing number of grating teeth 15 are suppressed from the phase section 2 to the longitudinal edge 24 of the DFB laser 1, leading to a decreasing grating coupling coefficient.

Figure 16:
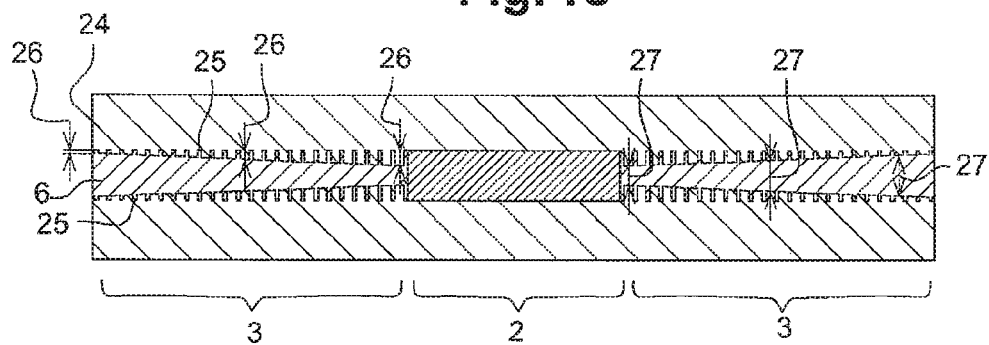
FIG. 16 illustrates schematically a top view cross section of a DFB laser source in another embodiment

The reduction of the grating layer 8 filling ratio and/or the progressive suppression of grating teeth 15 from the phase section 2 to the longitudinal edge 24 of the DFB laser 1 ensure the variation of the grating coupling coefficient in the Bragg sections 3 as described above FIG. 16 illustrates schematically a top view cross section of a DFB laser 1 in another embodiment.

In this embodiment, the Bragg grating is etched directly in the waveguide layer 6. More particularly, the grating teeth 15 are directly laterally etched in the waveguide sidewalls 25. The grating teeth 15 are then etched in the waveguide layer 6 during the etching step aiming to obtain the form of a strip of the waveguide 6.

Figure 17:
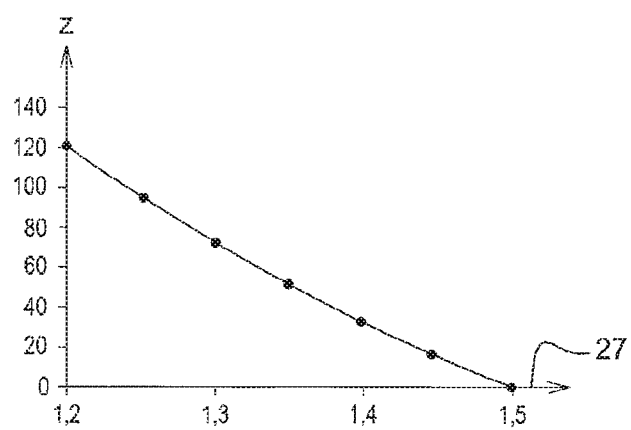
FIG. 17 is a graphical representation of the grating coupling coefficient according to the depth of the grating teeth 15 in FIG. 16.

A variation of the depth 26 of the grating teeth 15 along the Bragg sections 3 allows a variation of the grating coupling coefficient in the Bragg sections 3. The depth 26 of the grating teeth 15 decreasing from the phase section 2 to the longitudinal edge 24 of the DFB laser 1 ensures a high grating coupling coefficient aside the phase section 2 and a lower grating coupling coefficient on the longitudinal edge 24 of the DFB laser 1. As for the DFB laser 1 illustrated in FIG. 14 or 15, the variation of the depth 26 of the grating teeth 15 along the Bragg section 3 ensures a larger tuning range while maintaining a mono-modal behavior of the DFB laser 1. An example of the variation of the grating coupling coefficient is illustrated on FIG. 17 showing a graphical representation of the grating coupling coefficient Z, represented along the ordinate axis in $cm^{-1}$, according to the width 27 (see FIG. 16) of the waveguide layer 6 where the grating teeth 15 are etched, represented along the abscissa axis in µm. In a similar way, instead of being in the edges of the waveguide, the indentations can also be etched in the center of the waveguide, with a decreasing width from phase section 2 to the device end 24.

It is possible to use different variations of the Bragg grating in the DFB laser sections (linear, power, exponential decrease, and others). The variable Bragg grating may be used to shape the Bragg reflectivity of the DFB laser sections (amplitude and full width at half maximum) to modify the mode selectivity. The variation of the Bragg grating may be implemented by using different techniques.

FIG. 18 is a graphical representation of the tuning range of a tunable laser as a function of a grating strength modulation.

FIG. 18 represents the achievable tuning range by current injection in the phase section 2 of a DFB laser 1 with single mode operation, for a mean grating coefficient of 40 cm-1 or 50 cm-1. When the grating coupling coefficient is constant (modulation strength=0 $cm^{-1}/µm$), the tuning range is between 1.15 and 1.17 nm for both curves. When there is a modulation of the grating strength, while keeping such a constant mean value, the DFB laser 1 keeps a monomodal behavior, but tunable range can be highly increased. For instance, with a grating strength mean value of 40 $cm^{-1}$, represented on curve 36, a modulation of the grating strength along the DFB laser 1 of 0.3 $cm^{-1}/µm$ ensures a tuning range width between 1.3 and 1.35 nm. With a grating strength mean value of 50 $cm^{-1}$ and a modulation of 0.3 $cm^{-1}/µm$ of the grating strength, represented on curve 37, the tunable range width can be increased to 1.25 nm.

Finally, a larger tuning range is reached and entirely covered whatever is the initial arbitrary phase condition. These better tuning characteristics are achieved together with good static laser performances (low threshold current and high optical output power), and without modifying the temperature of the DFB laser.

Thanks to the precise control of the wavelength, the tunable laser may also be employed to transmit data as a modulation of the optical frequency, i.e. by applying the baseband signal to the tuning electrode.

Figure 19:
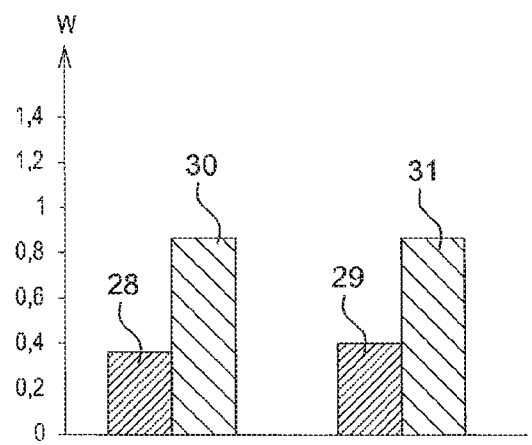
FIG. 19 is a graphical representation of the tuning range and the behavior of a first DFB with a constant grating coupling coefficient and a second DFB with a variable grating coupling coefficient both fabricated with the same wafer in a first example.

FIG. 19 is a graphical representation of the tuning range W, represented along the ordinate axis in nm, and the behavior of a first DFB with a constant grating coupling coefficient and a second DFB with a variable grating coupling coefficient both fabricated with the same wafer in a first example.

In the same wafer having a phase section made of passive material and a length of 100 µm, experimental measurements have shown that:
- a constant grating coupling coefficient 28 of 82 $cm^{-1}$ leads to a multimodal behavior with a tuning range less than 0.4 nm;
- a constant grating coupling coefficient 29 of 75 $cm^{-1}$ leads to a multimodal behavior with a tuning range of 0.4 nm;
- a variable grating coupling coefficient 30 starting from 98 $cm^{-1}$ aside the phase section and decreasing to 66 $cm^{-1}$ on the edge of the DFB laser, thus keeping a mean grating coupling coefficient of 82 $cm^{-1}$, leads to a monomodal behavior with a tuning range greater than 0.8 nm;
- a variable grating coupling coefficient 31 starting from 98 $cm^{-1}$ aside the phase section and decreasing to 52 $cm^{-1}$ on the edge of the DFB laser, thus keeping a mean grating coupling coefficient of 75 $cm^{-1}$, leads to a monomodal behavior with a tuning range greater than 0.8 nm.

Figure 20:
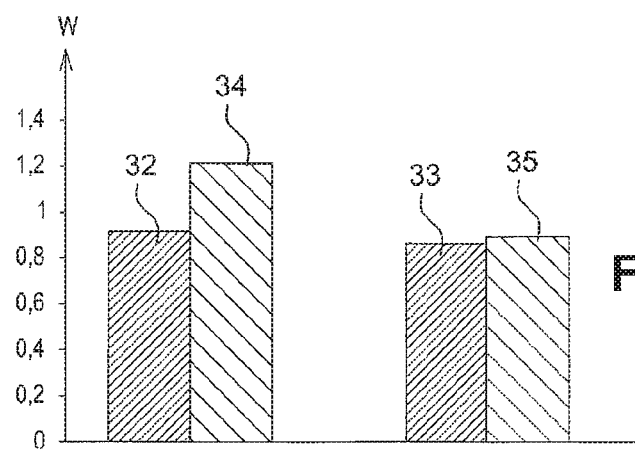
FIG. 20 is a graphical representation of the tuning range and the behavior of a first DFB with a constant grating coupling coefficient and a second DFB with a variable grating coupling coefficient both fabricated with the same wafer in a second example.

FIG. 20 is a graphical representation of the tuning range W, represented along the ordinate axis in nm, and the behavior of a first DFB with a constant grating coupling coefficient and a second DFB with a variable grating coupling coefficient both fabricated with the same wafer in a second example.

Another experiment with another wafer having a phase section made of passive material and a length of 100 µm has shown that:
- a constant grating coupling 32 coefficient of 82 $cm^{-1}$ leads to a multimodal behavior with a tuning range less than 1 nm;
- a constant grating coupling 33 coefficient of 75 $cm^{-1}$ leads to a monomodal behavior with a tuning range greater than 0.8 nm;
- a variable grating coupling coefficient 34 starting from 98 $cm^{-1}$ aside the phase section and decreasing to 66 $cm^{-1}$ on the edge of the DFB laser, thus keeping a mean grating coupling coefficient of 82 $cm^{-1}$, leads to a monomodal behavior with a tuning range greater than 1.2 nm;
- a variable grating coupling coefficient 35 starting from 98 $cm^{-1}$ aside the phase section and decreasing to 52 $cm^{-1}$ on the edge of the DFB laser, thus keeping a mean grating coupling coefficient of 75 $cm^{-1}$, leads to a monomodal behavior with a tuning range greater than 0.8 nm and greater than with a constant grating coupling coefficient of 75 $cm^{-1}$.

The differences between the two experimental are caused by manufacturing artifacts, but both show an improved tuning range with monomodal behavior when decreasing the coupling ratio coefficient along Brag sections while keeping the same mean value.

The above-described laser sources are directly applicable to wavelength control of transmitters in WDM systems, or for any application based on phase modulation (coherent transmissions, chirp management in dual modulation, and others . . . ). Bragg sections with variable coupling coefficient may also be integrated in Distributed Bragg Reflector lasers.

The invention is not limited to the described embodiments. The appended claims are to be construed as embodying all modification and alternative constructions that may be occurred to one skilled in the art, which fairly fall within the basic teaching here, set forth.

The use of the verb "to comprise" or "to include" and its conjugations does not exclude the presence of elements or steps other than those stated in a claim. Furthermore, the use of the article "a" or "an" preceding an element or step does not exclude the presence of a plurality of such elements or steps.

The invention claimed is:

1. A tunable laser device comprising a multi-section distributed feedback (DFB) laser having:
   a first Bragg section in active material comprising a waveguide in the form of an elongate strip and a plurality of teeth extending perpendicular to the length direction of the strip of the waveguide, the grating teeth forming a Bragg grating,
   a second Bragg section in active material comprising a waveguide in the form of an elongate strip and a plurality of teeth extending perpendicular to the length direction of the strip of the waveguide, the grating teeth forming a Bragg grating,
   a phase section being longitudinally located between the first Bragg section and the second Bragg section, the phase section being made of a passive material, at least a portion of the phase section traversing through, and bisecting, the active material to cause a discontinuity in the active material, each Bragg section having a first longitudinal end joining the phase section and a second longitudinal end opposed to the phase section, wherein the Bragg grating of at least one Bragg section has a grating coupling coefficient which decreases from the first longitudinal end to the second longitudinal end of said at least one Bragg section.

2. A tunable laser according to claim 1, wherein both Bragg sections have a grating coupling coefficient which decreases from their first longitudinal end to their second longitudinal end, the grating coupling coefficients having mutually opposite gradients.

3. A tunable laser according to claim 1, wherein the Bragg sections comprise a grating layer in the form of an elongate strip, the grating layer comprising the grating teeth.

4. A tunable laser according to claim 3, wherein a filling ratio of the grating teeth in the longitudinal direction of the grating layer is one of increased from an initial value of 50% or more at the first longitudinal end towards the second longitudinal end of the at least one Bragg section and decreased from an initial value of 50% or less at the first longitudinal end towards the second longitudinal end of the at least one Bragg section.

5. A tunable laser according to claim 3, wherein the initial filling ratio of the grating teeth in the longitudinal direction of the grating layer at the first longitudinal end of the at least one Bragg section is between 45% and 55%.

6. A tunable laser according to claim 3, wherein the width of the grating teeth in the grating layer in a width direction perpendicular to the longitudinal direction of the strip of the grating layer varies from the first longitudinal end to the second longitudinal end of said at least one Bragg section.

7. A tunable laser according to claim 3, wherein each grating tooth has the same length in the longitudinal direction of the strip of the grating layer and an increasing number of grating teeth are suppressed from the first longitudinal end to the second longitudinal end of said at least one Bragg section.

8. A tunable laser according to claim 1, wherein, the Bragg grating of the at least one Bragg section is located in the waveguide of the at least one Bragg section, the grating teeth being etched directly in the waveguide, and wherein a lateral depth of the grating teeth in a width direction perpendicular to the longitudinal direction of the strip of the waveguide decreases from the first longitudinal end to the second longitudinal end of said at least one Bragg section.

9. A tunable laser according to claim 1, wherein the phase section is made of a semiconducting material with a bandgap between 1.3 µm and 1.45 µm.

10. A tunable laser according to claim 1, wherein one of the Bragg sections is longer than the other Bragg section.

11. A tunable laser according to claim 1, wherein the length of the phase section in the longitudinal direction is 100 µm.

12. A tunable laser according to claim 1, wherein the phase section includes an electrode able to inject current in the phase section.

13. A photonic integrated circuit including:
a tunable laser according to claim 1,
a modulator connected to the tunable laser to receive an output signal of the tunable laser to be modulated.

14. A photonic integrated circuit including:
a tunable laser according to claim 1,
a photodiode, the photodiode being located at an end of the tunable laser to monitor an optical power of the tunable laser.

15. An optical communication terminal including a tunable laser according to claim 1.

16. The tunable laser of claim 1, wherein the phase section consists of the passive material.

* * * * *